United States Patent
Torkkeli et al.

(10) Patent No.: US 12,043,542 B2
(45) Date of Patent: Jul. 23, 2024

(54) MEMS STRUCTURE INCLUDING A CAP WITH A VIA

(71) Applicant: MURATA MANUFACTURING CO., LTD., Nagaokakyo (JP)

(72) Inventors: Altti Torkkeli, Tuusula (FI); Antti Iihola, Helsinki (FI)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 437 days.

(21) Appl. No.: 16/807,783

(22) Filed: Mar. 3, 2020

(65) Prior Publication Data

US 2020/0283292 A1 Sep. 10, 2020

(30) Foreign Application Priority Data

Mar. 6, 2019 (FI) ..................................... 20195165

(51) Int. Cl.
*B81C 1/00* (2006.01)
*G02B 26/08* (2006.01)

(52) U.S. Cl.
CPC ...... *B81C 1/00301* (2013.01); *B81C 1/00134* (2013.01); *B81C 1/00269* (2013.01); *G02B 26/0858* (2013.01)

(58) Field of Classification Search
CPC ............ B81C 1/00301; B81C 1/00134; B81C 1/00269; B81C 2203/0118;

(Continued)

(56) References Cited

U.S. PATENT DOCUMENTS

| 8,201,452 B2 | 6/2012 | Oldsen et al. |
| 2003/0022475 A1 | 1/2003 | Vieux-Rochaz et al. |

(Continued)

FOREIGN PATENT DOCUMENTS

| CN | 103413780 B | 7/2015 |
| JP | 11-317474 A | 11/1999 |

(Continued)

OTHER PUBLICATIONS

Finnish Search Report dated Sep. 27, 2019 corresponding to Finnish Patent Application No. 20195165.

(Continued)

*Primary Examiner* — Shahed Ahmed
*Assistant Examiner* — Sun Mi Kim King
(74) *Attorney, Agent, or Firm* — SQUIRE PATTON BOGGS (US) LLP

(57) ABSTRACT

A microelectromechanical structure including a first wafer structure attached by bonding to a second wafer structure. The first wafer structure includes a build part of silicon wafer material, a through via, and an isolation structure separating the through via from the build part. The through via extends between a first electrical contact and a second electrical contact through the first wafer structure in a first direction. The first electrical contact of the first wafer structure is accessible externally and the second electrical contact of the first wafer structure connects to an internal electrical contact on the second wafer structure. In the first direction, the extent of the isolation structure includes a hollow section and a via fill section where the isolation structure is filled with solid electrically insulating material. enables considerable increase of gap height in MEMS structures.

10 Claims, 11 Drawing Sheets

(58) Field of Classification Search
CPC ............ B81C 1/00317; G02B 26/0858; B81B
2201/032; B81B 2201/042; B81B
2203/053; B81B 2207/095
See application file for complete search history.

(56) References Cited

U.S. PATENT DOCUMENTS

| | | |
|---|---|---|
| 2004/0132893 A1 | 7/2004 | Malone et al. |
| 2004/0263937 A1 | 12/2004 | Fujii et al. |
| 2005/0231793 A1 | 10/2005 | Sato |
| 2012/0140306 A1 | 6/2012 | Pinter |
| 2016/0229685 A1* | 8/2016 | Boysel .................... B81B 7/007 |
| 2017/0001858 A1 | 1/2017 | Adams et al. |
| 2017/0297898 A1 | 10/2017 | Torkkeli et al. |
| 2018/0059406 A1 | 3/2018 | Torkkeli |
| 2019/0002275 A1 | 1/2019 | Chang et al. |
| 2020/0006130 A1* | 1/2020 | Chang ............... H01L 21/31116 |

FOREIGN PATENT DOCUMENTS

| | | |
|---|---|---|
| JP | 2003-526207 A | 9/2003 |
| JP | 2011-112807 A | 6/2011 |
| JP | 2018-520893 A | 8/2018 |
| WO | 2015042700 A1 | 4/2015 |

OTHER PUBLICATIONS

Jul. 21, 2020 Search Report issued in European Patnet Application No. 20157643.

* cited by examiner

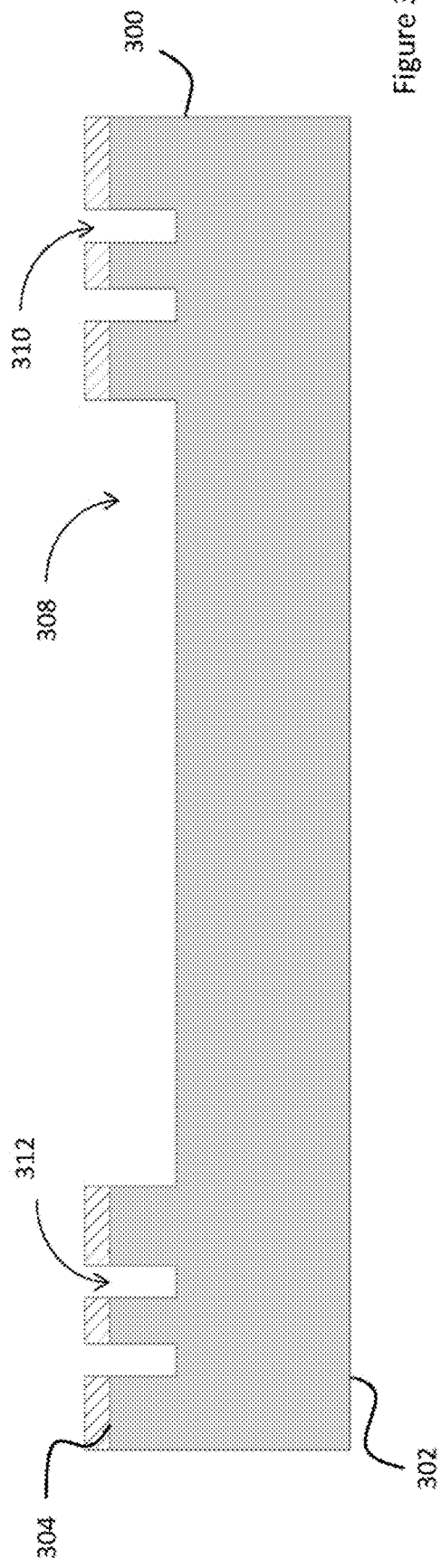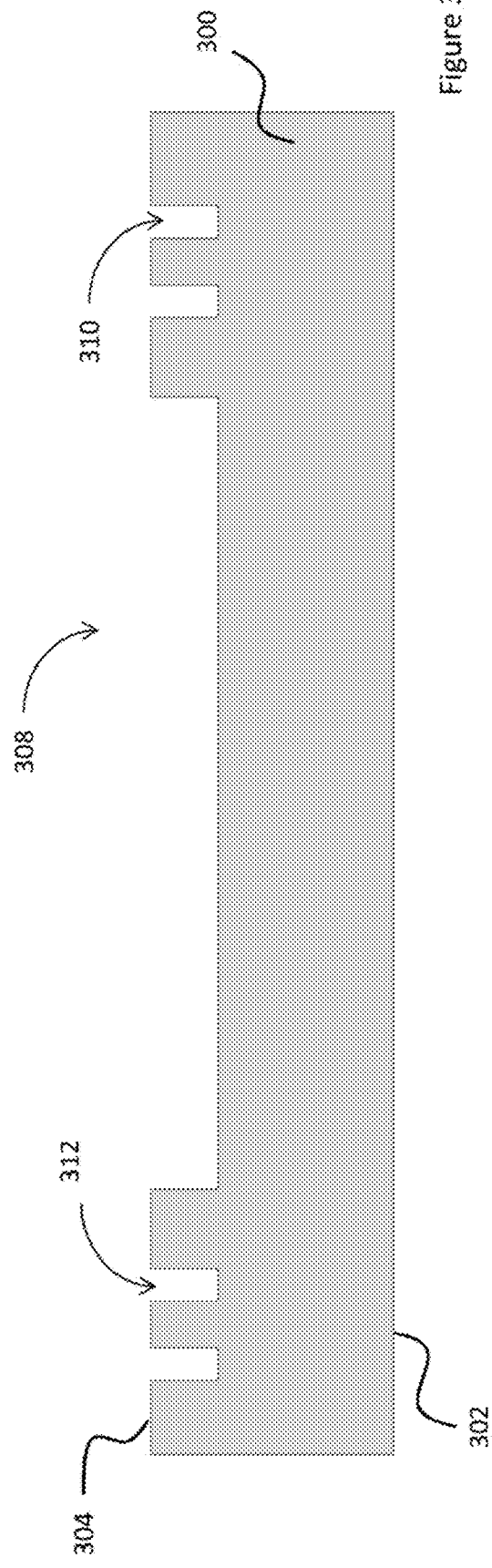

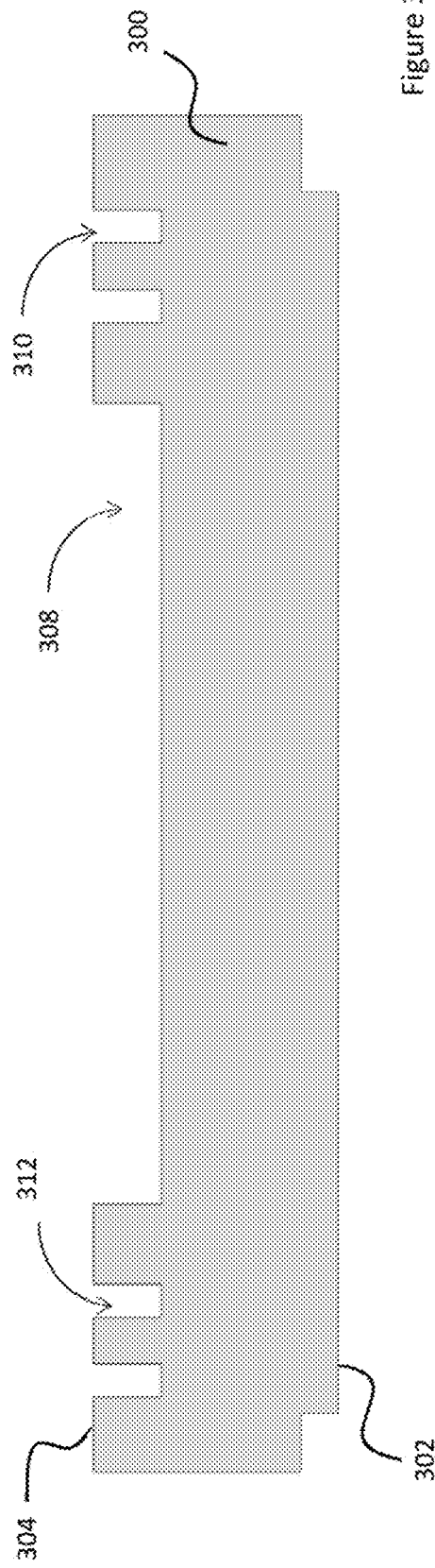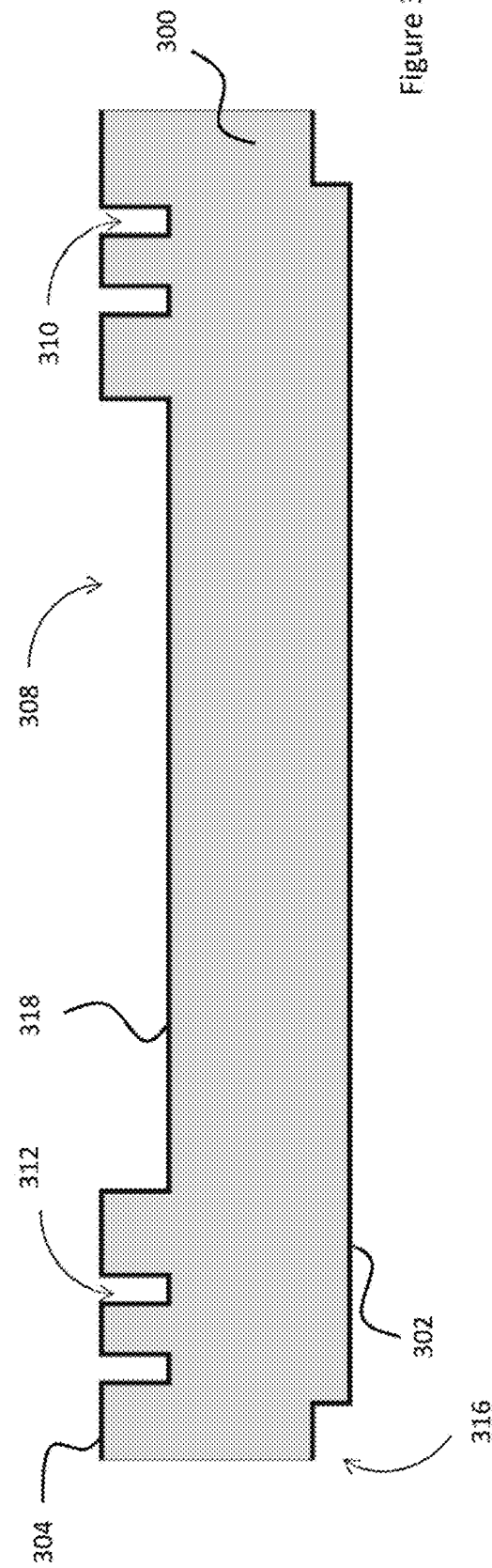

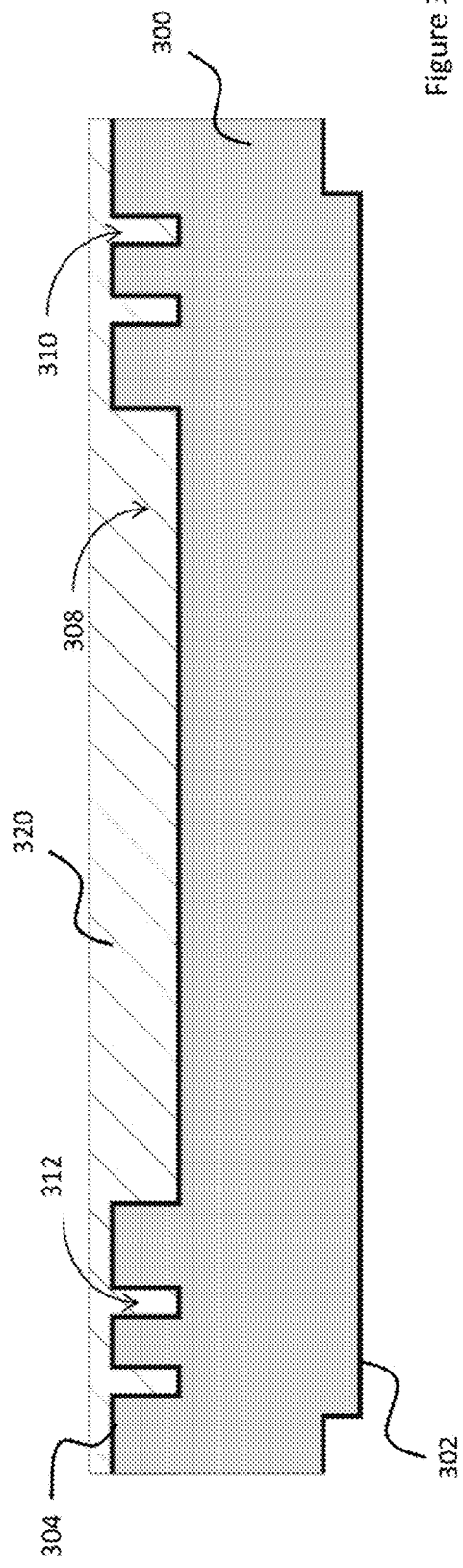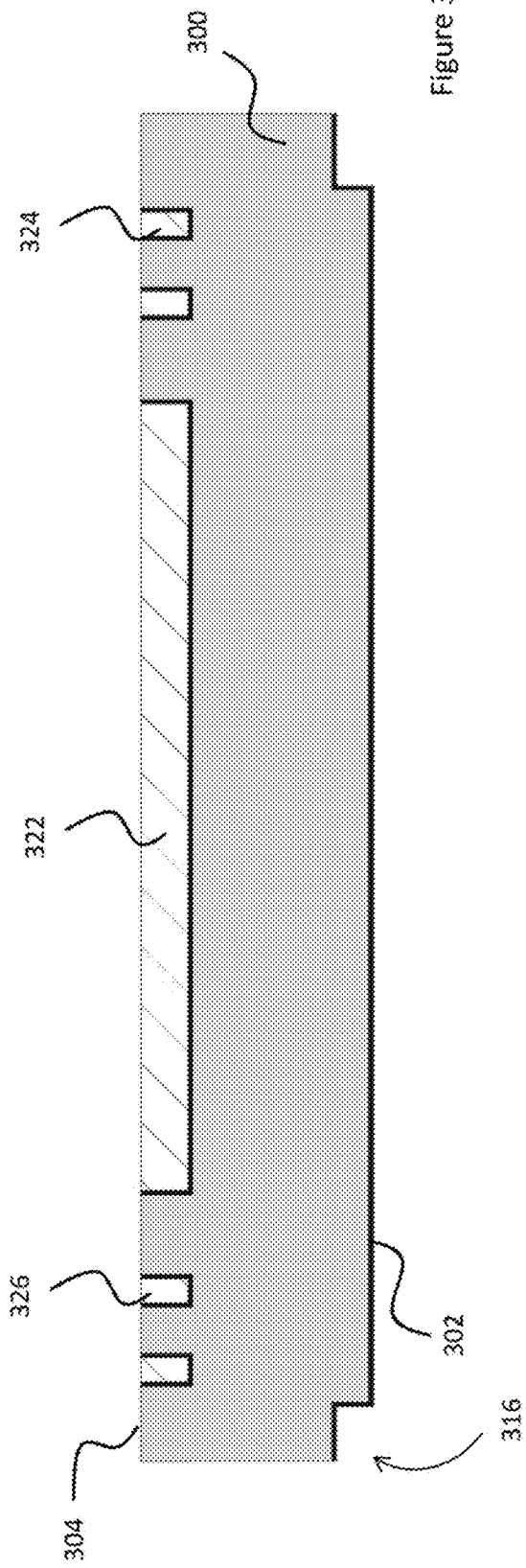

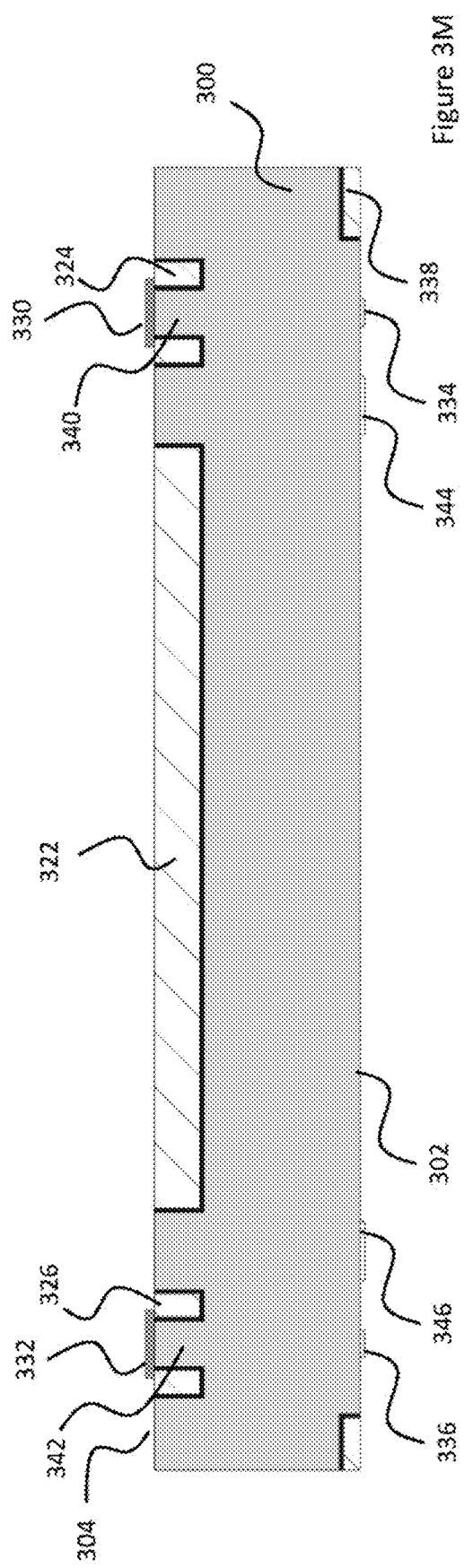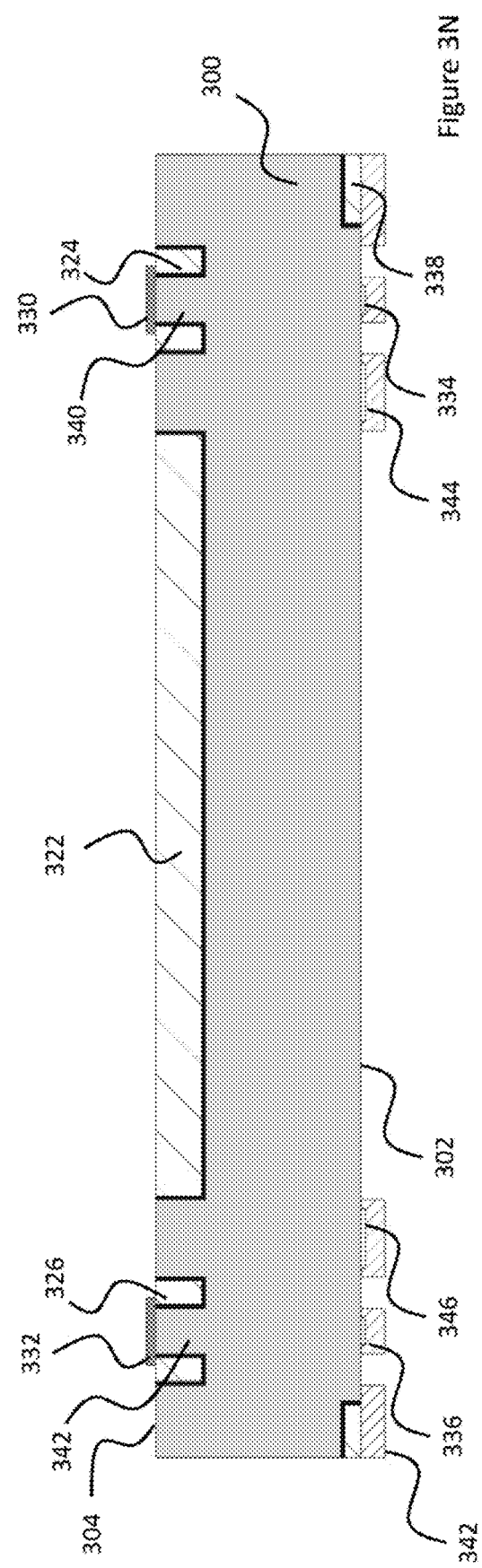

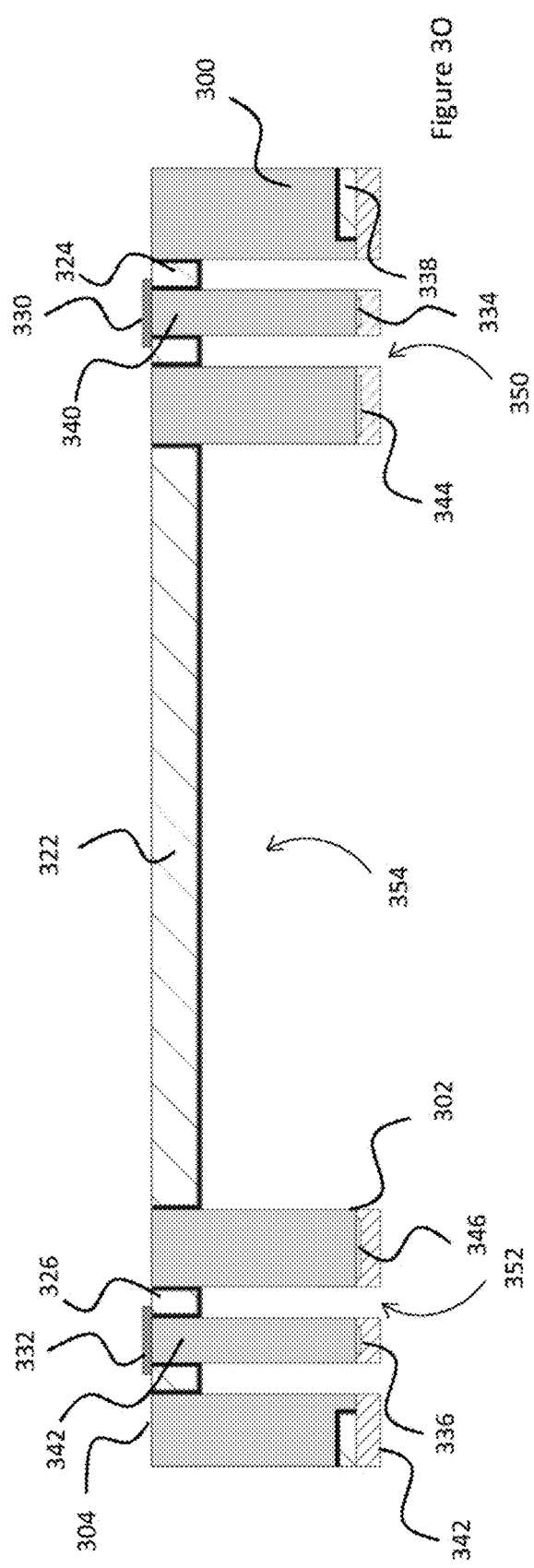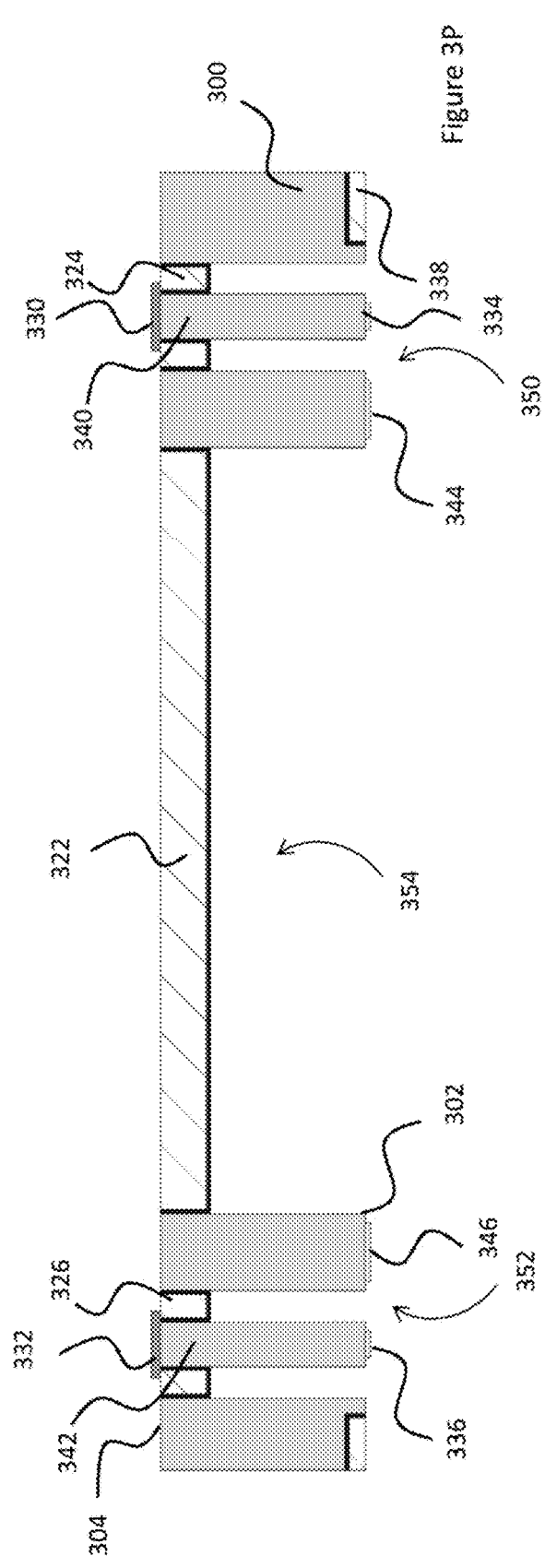

MEMS STRUCTURE INCLUDING A CAP WITH A VIA

FIELD OF THE DISCLOSURE

The present disclosure relates to microelectromechanical systems (MEMS), and more particularly to a microelectromechanical structure that includes a first wafer structure attached by bonding to a second wafer structure, and the first wafer structure includes a through via. The present disclosure further concerns a method for manufacturing a cap wafer structure for a MEMS structure.

BACKGROUND OF THE DISCLOSURE

Micro-Electro-Mechanical Systems, or MEMS can be defined as miniaturized mechanical and electro-mechanical systems where at least some elements have a mechanical functionality. Since MEMS devices and structures are created with the same or similar tools used to create integrated circuits, processes known from IC technologies can be applied in their manufacture. MEMS fabrication technology is, however, not easy to master. Due to the mechanical functions, dimensional requirements for MEMS structures are very strict.

For the mechanical functionality, MEMS structures include moving elements, typically tightly encapsulated into a gap between two silicon wafer structures. For example, mirrors for reflecting a beam of light have been developed based on microelectromechanical system (MEMS) technologies. In a MEMS scanning mirror, the direction of reflection can be changed as a function of time. The scanning mirror can direct a light beam over a range of directions in one or two dimensions, and it may also be used to collect light from a range of directions with good angular accuracy and resolution. Scanning operation over an angular range is obtained by tilting the mirror to an angle and varying this angle as a function of time. Often this varied tilting is done in a periodical or oscillating manner. There are several applications for such scanning mirrors, e.g. code scanners, scanning displays and laser ranging and imaging sensors (Lidars).

As an example, document U.S. Pat. No. 8,201,452 B2 discloses a conventional housing for micromechanical and/or micro-optic components, wherein the housing has a supporting substrate with at least one micromechanical and/or micro-optic component and at least one cap substrate, which is joined to the supporting substrate.

Optical sensors are a good example of MEMS structures that pose special requirements for wafer-level designs. Specifically, the sensor structure needs to be mechanically very tight to enable stable conditions within the gap, and at the same time the gap has to provide enough room for vertical play of the tilting motion of the mirror. These two requirements may be achieved simultaneously with a structure that includes two wafer structures that are bonded together, and the bonded surfaces form a continuous, mechanically and electrically uniform perimeter around the gap. The moving parts need to be inside the gap, and for securely tight bonding, electrical signals for moving or sensing the motion of the moving parts need to be led to them through at least one of the wafer structures, preferably the cap wafer. However, processes for fabrication of wafer structure that includes both a through via structure and a vertically high gap pose various, even contrasting requirements and tolerances. Conventionally, they have been dealt with by large safety margins in manufacturing processes and designs. Due to this, it has not been possible to use the thickness of build wafers optimally for the height of the gap. Furthermore, with known methods, provision of both vertical through via structure and high gap has required separate etch steps which are time-consuming and add costs of manufacturing.

BRIEF DESCRIPTION OF THE DISCLOSURE

An object of the present disclosure is to provide a MEMS structure and a method for implementing the MEMS structure so as to optimally address the above requirements.

The object of the disclosure is achieved by a microelectromechanical structure, and a method for manufacturing a cap wafer structure for the microelectromechanical structure, which are characterized by what is stated in the independent claims. Advantageous embodiments of the disclosure are disclosed in the dependent claims.

The disclosure is based on the idea of forming a gap at least partly into a wafer structure that includes a through via and separating the through via from the wafer structure by an isolation structure that includes a hollow section and a via fill section of solid electrically insulating material, This structural form eliminates some significant overdimensioning needs in manufacture and therefore enables considerable increase of gap height in MEMS structures. In addition, this improvement is possible to achieve with a simple, streamlined manufacturing process. Further advantages of the proposed structure are discussed more in the detailed description.

BRIEF DESCRIPTION OF THE DRAWINGS

In the following the disclosure will be described in greater detail by means of preferred embodiments with reference to the accompanying drawings, in which.

DETAILED DESCRIPTION OF THE DISCLOSURE

Figure 1:
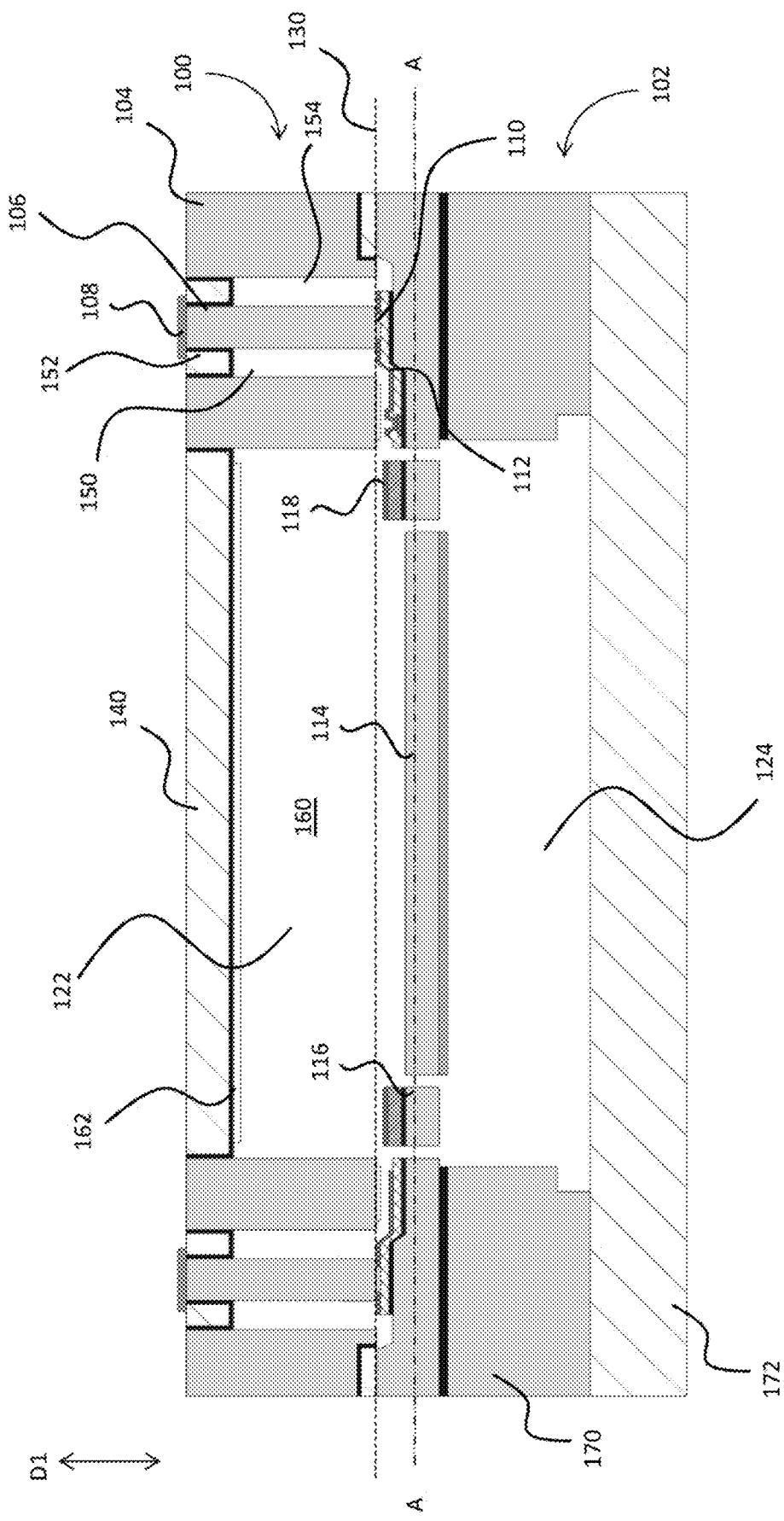
FIG. 1 illustrates an example of a microelectromechanical (MEMS) structure.

FIG. 1 illustrates an example of a microelectromechanical (MEMS) structure. A MEMS structure typically has an internal part that includes moving elements and hollow regions that facilitate the movement of these elements to implement the mechanical function of the MEMS structure. The MEMS structure of FIG. 1 includes a first wafer structure 100 and a second wafer structure 102. The first wafer structure 100 and the second wafer structure 102 are attached to each other by bonding. Bonding refers herein to a process that fastens a surface of the first wafer structure 100 to a surface of the second wafer structure 102 in a mechanically stable and airtight manner. Practical MEMS processes use modified semiconductor device fabrication and packaging technologies, so the referred bonding is often one of successive wafer-level processes, wherein a large number of MEMS structures are manufactured jointly, and then diced for separate use. The bonded surfaces of the first wafer structure 100 and the second wafer structure 102 form a continuously closed peripheral region in a plane around the internal part so that a hermetically sealed internal gap 160 is formed into the MEMS structure. The first wafer structure 100 and the second wafer structure 102 have a general planar form that extends in two orthogonal spatial dimensions (e.g. length and width) that define a reference plane 130, and a reference plane 130 aligns to the closed peripheral region between them. The first wafer structure 100 and the second wafer structure 102 have also a third spatial dimension (e.g. thickness) that is normal to the reference plane 130. The direction of that dimension is hereinafter referred to as the first direction, and it is shown with arrow D1 in FIG. 1.

The first wafer structure 100 includes a build part 104 of silicon wafer material. The term build part implicates that the manufacturing process of the first wafer structure may start from a pre-processed build wafer that is thereafter micromachined for necessary electrical and mechanical functions of the MEMS structure. The build wafer may initially be a uniform wafer plate or readily include one or more pre-processed structures applicable in later microfabrication steps. The build part refers herein to a part that has been diced out of a build wafer, and forms one unitary element of the first wafer structure.

The first wafer structure 100 includes one or more through vias 106. The term through via refers herein to an element that extends through the first wafer structure 100 in the first direction D1. The through via 106 is a lead structure that enables electrical connection through the first wafer structure, meaning from one side of the first wafer structure to another side of the first wafer structure. The through via is advantageously of the same silicon wafer material as the build part and formed by removing silicon wafer material by etching the build part. In one end of the through via 106 is a first electrical contact 108 that is accessible externally. The first electrical contact 108 can then be connected, for example, to an electrical component that includes circuitry for controlling the functions of the MEMS structure. In the other end of the through via 106 is a second electrical contact 110 that can be used to form a connection to an internal electrical contact 112 on the second wafer structure 102.

In the example of FIG. 1, moving elements in the internal part include an oscillating mirror element 114 and suspender element 116 that connects the mirror element 114 elastically to the second wafer structure 102. A recess 122 in the first wafer structure 100 and another recess 124 in the second wafer structure 102 combine into a continuous hollow region. The combination of recesses 122, 124 forms into the MEMS structure the gap 160, a void or gas-filled space in which the suspender element 116 and the oscillating mirror element 114 can move in the first direction D1.

To actuate the motion of the mirror element, the internal contact 112 is connected to a transducer structure 118. The transducer structure 118 includes an actuator that converts energy provided in form of electrical signal into mechanical motion. In FIG. 1, the transducer structure 118 includes piezoelectric layers deposited on elongate suspenders of the suspender element 116. The piezoelectric layers generate internal mechanical strain that results from an electrical field applied to the layers through the internal contact 112. The strain is carried over to the elongate elastic suspenders of the suspender element 116 and causes them to bend accordingly. One end of each suspender is connected to the second wafer structure and the other end is connected to a connection point in an edge of the mirror element 114. When the electrical field varies periodically, one end of the suspender remains fastened to the second wafer structure and the other end rises by bending of the suspender, and at the same time moves the edge of the mirror element at the connection point with respect to the second wafer element. The suspenders can thus be configured to co-ordinately drive the mirror element 114 to its oscillating motion.

Figure 2:
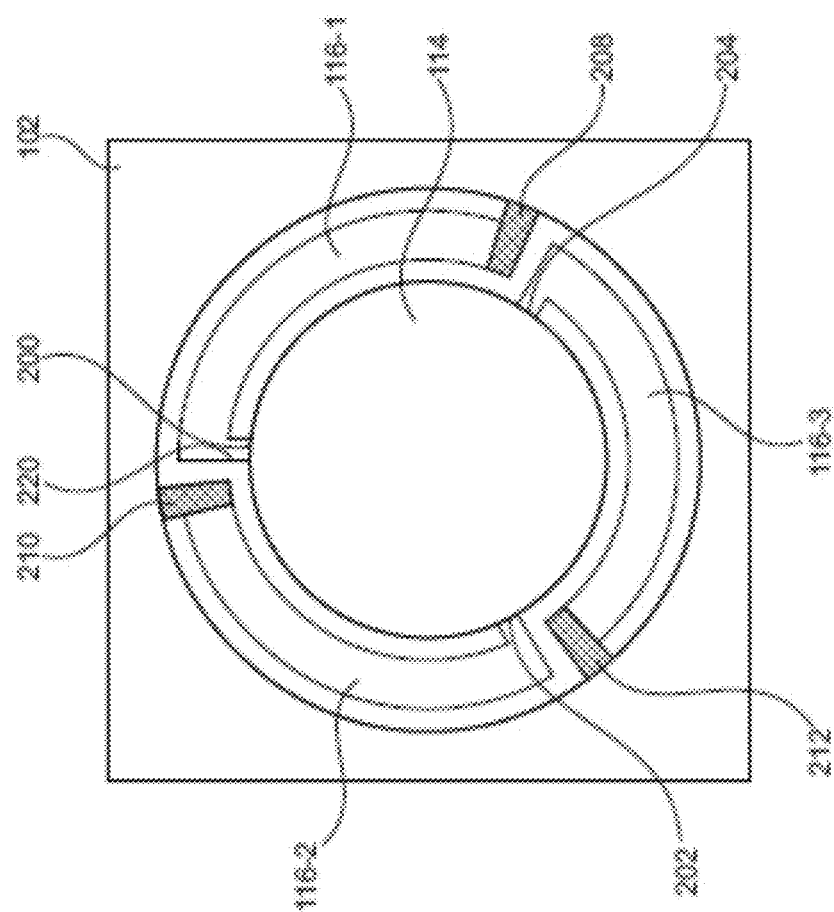
FIG. 2 shows a cross section along lines A-A of FIG. 1.

FIG. 2 shows a cross section along lines A-A of FIG. 1, illustrating a simplified example configuration for the movable elements, including the mirror element 114 and suspenders 116-1, 116-2, 116-3 of the suspender element 116. The moving elements shown in FIG. 2 may be considered to form a scanning reflector system. In FIG. 2, the second wafer structure 102 provides a support to which the suspenders 116-1, 116-2, 116-3 connect to elastically suspend the mirror element 114. The term support thus represents here a rigid, locally inert reference to which movable elements of the reflector system can be fixed, or from which movable elements of the reflector system can be suspended. The support and the movable elements may be, for example, coupled to each other through one or more fixing points protruding from a support beneath the movable elements. Alternatively, as shown in FIG. 2, the support may include a frame that is a part of, or rigidly fixed to an underlying substrate layer and surrounds the reflector.

The term mirror element 114 refers herein to any element that includes a solid reflective surface that returns back an incident wavefront of light. The law of reflection states that for each incident ray, the angle of incidence equals the angle of reflection, and the incident, normal and reflected directions are coplanar. In microelectromechanical systems, a reflective surface of the mirror element may be implemented, for example, by means of a silicon plate coated with a reflective coating. The reflective coating may include, for example, one or more metal thin film layers, such as aluminium, silver, gold or copper films. Alternatively, the coating may comprise a stack of one or more dielectric films with different refractive indexes, where the films are arranged so that the stack reflects light. Advantageously, the reflective surface is planar.

The suspender element 116 of FIG. 2 comprises one or more suspenders 116-1, 116-2, 116-3. Each suspender is flexible such that it supports the weight of the mirror element, but it also moves or allows movement of the mirror element in relation to the support. In static, non-actuated states of the mirror element, i.e. when the mirror element is supported but does not move, the planar reflective surface is considered to be parallel to the reference plane 130. Due to elasticity of the suspender material, parts of each suspender, and thus a part of the mirror element coupled to the suspender, can move at least in one direction in relation to the support. Each suspender 116-1, 116-2, 116-3 may include an elongate elastic element with two ends, a first end and a second end. For example, a first end of a suspender 116-1 may be coupled to a first coupling point 200 in an outer edge of the planar mirror element, and a second end of the suspender 116-1 may be fastened to a second coupling point 208 in the support. The suspender 116-1 may be configured to deflect at least in the out-of-plane direction that is parallel to a normal to the planar reflective surface. A suspender can be, for example, a silicon beam formed from the same silicon substrate layer as a plate that forms the planar reflective surface.

The reflector system may include a first transducer structure for mechanical actuation of the mirror element 114. In the exemplary embodiment of FIG. 2, the suspenders suspending the mirror element 114 from the support may include piezoelectric actuators. The term piezoelectric actuator refers here to a piezoelectric component which undergoes physical deformation in response to a voltage applied to the component. An actuator can be used to drive oscillating movement of the mirror element 114 when it is controlled with a periodic AC voltage signal. A bending piezoelectric actuator that deflects a suspender in the out-of-plane direction may include piezoelectric layers and conductive layers, coated on the suspender. For example, in MEMS optical devices, an approximately 50 μm thick layer of silicon is sufficiently thin to bend with the piezoelectric material when a voltage is applied. Bending piezoelectric actuators may include a piezoelectrically active layer, such as aluminium nitride, to facilitate actuation movement. The bending piezoelectric actuator may also include metal electrode layers on two sides of the piezoelectrically active layer so that the actuation movement can be controlled by voltage signals. The electrodes may, for example, be prepared from molybdenum, aluminium or titanium.

In the exemplary microelectromechanical reflector system of FIG. 2, each suspender 116-1, 116-2, 116-3 is coupled from a respective first coupling point 200, 202, 204 to the mirror element 114, and from a respective second coupling point 208, 210, 212 to the support. It is noted that the suspender configuration of FIG. 2 is exemplary, the amount, form and positions of suspenders and coupling points can be varied within the scope. Coupling through a coupling point may be fixed or transmitted. Fixed coupling refers herein to a mechanically rigid connection where an end of a suspender is securely placed or fastened to a coupling point. For example, the second coupling points 208, 210, 212 in FIG. 2 are fixed, and may provide also a route for leads of electrical connection for actuation. Transmitted coupling refers herein to a configuration where an end of a suspender is connected to a coupling point through an intermittent element that may deflect or twist between them. For example, in order to reduce risk of breakages, the connection between the first end of the suspender 116-1 and the first coupling point 202 in the mirror element 114 may be a transmitted coupling that directly relays the movement of the first coupling point 202 in the out-of-plane direction to the mirror element 114 through an intermittent coupling element 220, but the coupling element 220 is also configured to undergo slight bending and/or torsion to reduce internal stress of the suspender coupling in the extremes of the suspender deflection.

When the reflecting surface of the mirror element in non-actuated state is considered to align to the reference plane, the resilient suspenders 116-1, 116-2, 116-3 and the piezoelectric actuators on the suspenders enable first ends of the suspenders to move in the out-of-plane direction with respect to the reference plane 130. These displacements may be applied to induce the reflector into a multidirectional scanning motion that can be expressed as oscillation about two axes of rotation. The oscillation of the mirror element 114 can be driven by applying a periodic AC voltage to one or more of the bending piezoelectric actuators extending on the elongate suspenders 116-1, 116-2, 116-3.

For controlled oscillation of the mirror element, the reflector system may include a second transducer structure, configured to generate sense signals that represent mechanical motion of the reflector. One possible method to achieve this is to sense realized displacements or deflections of the suspenders. For this, one or more, advantageously all of the suspenders can be provided with piezoelectric sense elements, in addition to the piezoelectric actuators. The term sense element may be a piezoelectric component that generates a voltage signal in response to a physical deformation induced to it by motions of the reflector. Each suspender of the spring structure may include an actuator element and a sense element. Piezoelectric transducers are advantageous for oscillating reflector system applications due to their compact size and low drive voltage requirement.

When voltages for piezoelectric actuation of an internal mirror element are provided through the first wafer structure, the bonded connection between the first wafer structure and the second wafer surface is tight and very reliable. As discussed earlier, use of the disclosed first wafer structure as a cap wafer with through via would therefore be preferred in designs. However, having an isolated through via and a gap recess in a same cap wafer is somewhat problematic, when the height of the gap recess needs to be maximized, for example to allow large oscillating motion of an enclosed mirror element.

Returning back to FIG. 1, it may be seen that the through via 106 is separated from the build part 104 by an isolation structure 150. The isolation structure refers here to an element that surrounds the through via 106 within the build part 104 and creates around the through via a region that provides high resistance for direct electrical current (DC) and low capacitance for alternating electrical current (AC). Conventionally, the isolation structure in MEMS structures has been provided by a glass sheath that envelops a silicon through via in a silicon build part. In the structure of FIG. 1, the isolation structure is different. The extent of the isolation structure 150 in the first direction includes a via fill section 152 where the isolation structure includes solid electrically insulating material, and a hollow section 154. It is noted that the term fill in this context does not relate to any specific means or method used for introducing the electrically insulating material into the isolation structure. The via fill section refers here to a continuous region of electrically insulating material that extends conformally over a cross-section of the isolation structure, and forms a mechanical barrier, in other words a plug that prevents flow of volatile substances through the cross-section. The solid electrically insulating material may be glass, for example, sodium borosilicate glass that has a coefficient of thermal expansion close to the one of silicon. Other materials (e.g. silicon dioxide) suitable for the purpose may, however, be used within the scope.

The MEMS structure of FIG. 1 comprises also a gap fill section 140 that extends over the first recess 122. Let us consider MEMS elements in which a mirror element oscillates in a scanning motion within a gap 160, as shown in FIG. 1. As mentioned earlier, the first recess 122 in the first wafer structure 100 and the second recess 124 in the second wafer structure 102 form the internal gap 160 into the MEMS structure. It is easily seen that the higher the gap is, the larger the amplitude of the oscillation, and thus the amplitude of the scanning motion of the mirror element 114 can be. The limitation for the amplitude depends at least partly on the height of the gap, i.e. the height of the recesses 122, 124. The height of the first recess 122, on the other hand, depends by far on the processes for creating the through via 106 that extends from one side of the first wafer structure to the other side of the wafer structure. Theoretically one would try to simply increase the height of the gap by manufacturing MEMS structures from thicker wafer discs and etching deeper recesses. This is, however, not easy to do in practise.

Let us call the first wafer structure a cap wafer. Through vias are typically formed into a cap wafer by first etching a recess that penetrates steeply from one side into a wafer, filling the trench with glass material, and then grinding the other side of the wafer so that the trench is exposed in both sides of the wafer. In solutions where the cap wafer is to include a recess for the internal gap and the through via, the recesses are conventionally made to a build wafer in separate etching processes, a first etching process for fabricating one or more recesses for the one or more vias, and a second etching step for fabricating one or more recesses for internal gaps. Each of these processes has some variations and introduces dimensioning issues that need to be taken into consideration, and now the consideration needs also be made in combination. This has conventionally led to some design complications.

Presently, the most common method for deep etching is deep reactive ion etching (DRIE) that uses alternating etch and passivation cycles for high anisotropy and etch rates. A typical DRIE system applies a high-density plasma, and an independent substrate power bias to provide directional ion bombardment during an etch step. In a passivation step, a protective layer of polymer is deposited in a conformal manner. During the etching step the sidewalls of the silicon trench are relatively protected but the bottom of the trench being formed is pierced by the directional ion bombardment. The repetition of these passivation/etch cycles allows creation of high aspect ratio silicon structures. However, the term deep etching refers herein to any etching method that is based on exposing the material to directional bombardment of ions that dislodge material from an exposed surface and that is stopped by a layer of electrically insulating material.

The applied etching processes are typically so-called blind etching processes, in which material removal parameters are fixed beforehand. This means that after a certain period of time, based on the information of the bulk material etch rate, a predefined etching process is configured to automatically stop. When a number of MEMS structure chips are manufactured in a same etching process from a wafer disc, recesses in chips disposed in edges of the wafer disc tend to be deeper than recesses in more centrally disposed chips. This phenomenon is very typical for the deep reactive ion etching (DRIE) process. Accordingly, after the first blind etching step for the through vias, the grinding of the disc, on the side opposite to the first etching step, needs to be extended far enough to expose through vias in all chips throughout the disc. This means that the predefined parameters for the first etching process need to be adjusted according to the centrally disposed chips, to ensure that the through vias also in them are certainly exposed in the subsequent grinding process. On the other hand, predefined parameters controlling the second etching step for the recess of the internal gap need to be adjusted to extend only to a depth that ensures that a layer that remains over the gap is thick enough to endure grinding and to safely close the internal gap. Accordingly, the contrasting variations accumulating from the two etching processes in combination complicate design of vertical dimensions of the cap wafer and limit the possible gap height achievable with available disc thicknesses.

Another technical aspect relates to horizontal dimensions, meaning dimensions of the through via or the isolation structure in the reference plane. In conventional methods, a recess for the isolation structure must be relatively wide to appropriately facilitate its filling with electrically insulating material. On the other hand, after the first etching process and before insertion of the solid electrically insulating material, the through via rises up from the build part like a pillar. Conventionally, the via needs to be designed thick enough to endure the subsequent process stages, for example a glass melting stage, or chemical vapor deposition of silicon dioxide. Such requirements for broader horizontal dimensions directly result in larger chip sizes. Any such design limitation and restriction imposed on design dimensions is carefully avoided, if possible.

MEMS structures where the isolation structure includes the hollow section, for example as shown in FIG. 1, solve or at least alleviate some of these problems. In order to demonstrate effects of the disclosed method, dimensions applied in some typical processes may be provided in the following with the description. The scope is not, however, limited to any specific dimensions mentioned herein.

As will be described in more detail in the following, recesses for electrically insulating regions that hermetically close the isolation structure can be manufactured into one side of a build wafer. One or more recesses for the gap and one or more recesses for hollow parts of the isolation structures can then be etched from the opposite side of the wafer, and the via fill section will define an etch stop for the deep recess etching.

Accordingly, when penetration of the deep etching is automatically stopped by the electrically insulating layer, duration of the deep etching can be predefined more freely to ensure a desired height of the recess in all chips of the disc. Specifically, if the deep recess etching of a disc is used to create in a same etching step a recess for hollow sections of a through via and a recess for the internal gap, the deep etching can be adjusted to achieve a desired, optimal extent of the internal gap recess in centrally disposed chips of a build wafer without compromising the thickness of any part of the first wafer structure that on the other side close the internal gap. Accordingly, the vertical height of the build wafer can be more effectively utilized to provide higher gaps, and thus enable larger amplitudes for the mirror element. In an exemplary 1300 micrometer build wafer, the proposed configuration enables increase of gap recess depth from 650 to at least 750 micrometers.

Furthermore, the proposed solution requires less grinding on the back side of the cap wafer. As discussed above, in conventional processes, the back side of the build wafer needs to be ground to expose all through vias. As shown in FIG. 1, the fill section of the isolation structure starts from the back side surface of the build part. Accordingly, in order to expose the through via, one only needs to grind away excess glass after melting. In the exemplary 1300 micrometer build wafer, grinding depth is thus reduced by around 100 micrometers. Again, this enables more of the height of the silicon wafer disc to be used for the height of the gaps.

It can also be seen in FIG. 1 that the height of the cap wafer can be deep recess etched in two parts. In conventional processes the glass sheath extends over the whole through via and there is a risk of breakage, for example, the glass melting pressure may break thin silicon via pillars. When the isolation structure includes the hollow section, the glass melting pressure has an effect on an etched via pillar only in the first etching step, where the molten glass layer is thinner and the part of the via exposed to is correspondingly shorter. This means that vias can be designed to be thinner than vias in conventional configurations.

Furthermore, when the recesses of the through vias and the recesses or the gaps can be etched in one etching process, less deep recess etching rounds are needed. Deep recess etching stages are one of the most expensive parts of the manufacturing process, so reduction of them has a direct impact on the cost of the resulting MEMS structure.

Figure 3A:
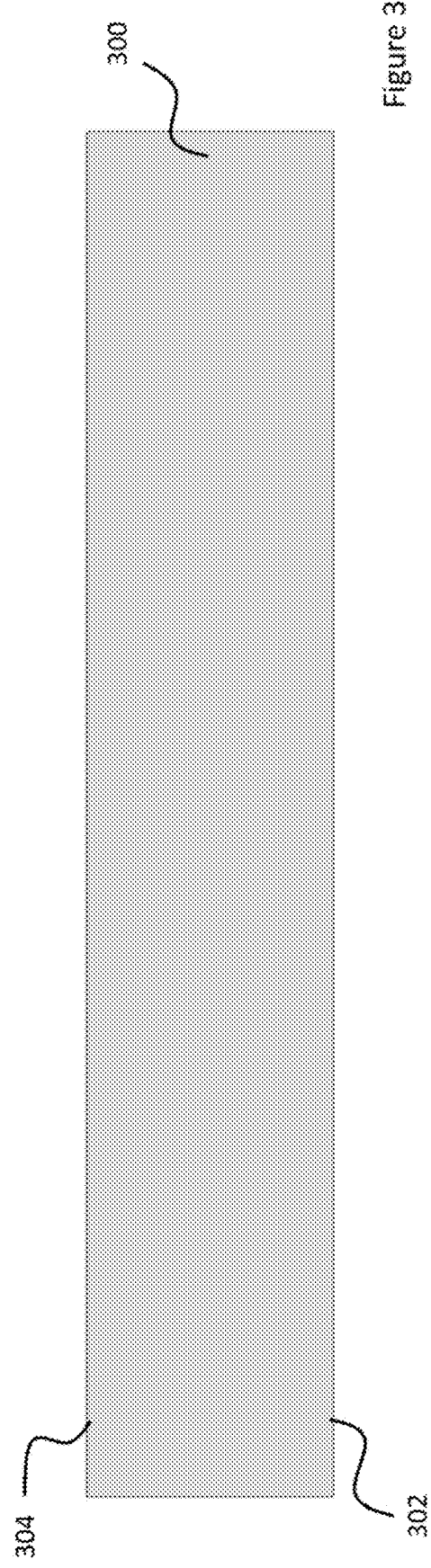
FIGS. 3A-3P that illustrate an exemplary method for manufacturing the first wafer structure of the MEMS structure in FIG. 1.

These advantages are elaborated in more detail with FIGS. 3A-3P that illustrate an exemplary method for manufacturing the first wafer structure of the MEMS structure in FIG. 1. The method is illustrated for one MEMS structure only, but it can be, and typically is, implemented in parallel for a plurality of MEMS structure chips manufactured from one build wafer. Accordingly, even if FIGS. 3A-3P show manufacturing stages with one build part of one MEMS structure only, the stages may be implemented for build parts of a plurality of MEMS structures processed in parallel of a build wafer. Therefore, the term "wafer element" is used in this description.

FIG. 3A shows a starting point for the method, a wafer element 300 of silicon material. Let us denote one side 302 of the wafer element as its front side, and the other side 304 as the back side of the wafer element.

Figure 3B:
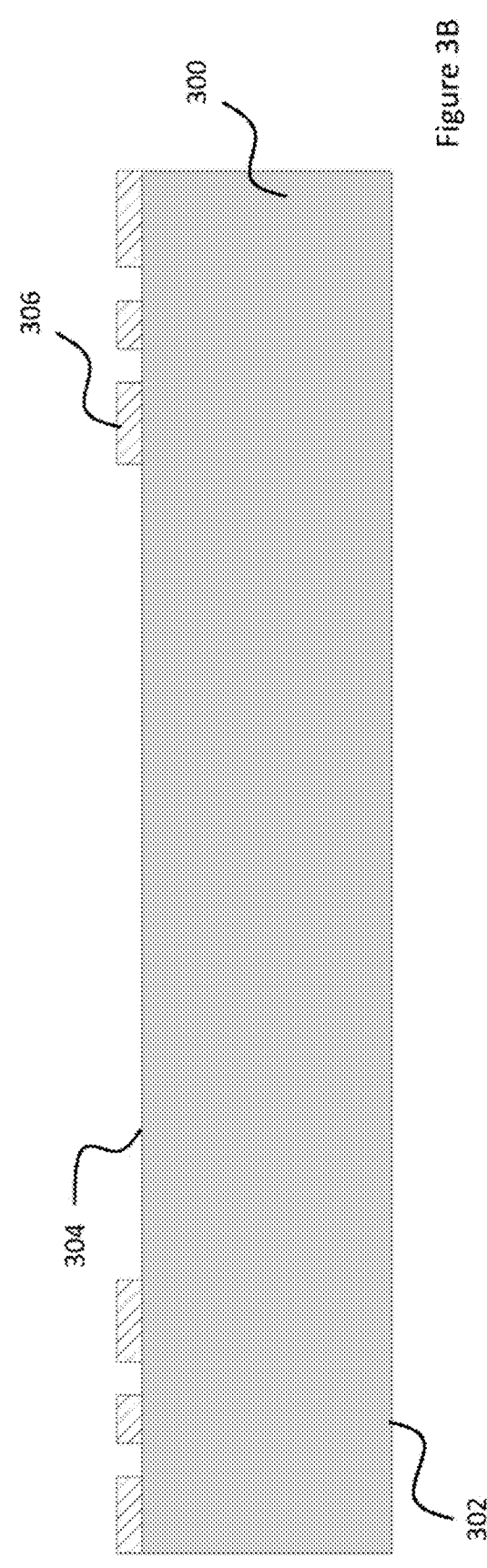

FIG. 3B illustrates deposition of a first resist mask 306 on the back side 304 of the wafer element. The resist mask 306 may be patterned to define parts of the back side 304 to be recessed for a first etching step. The first resist mask 306 may cover and thereby protect parts of the back side 304 that should not be etched out in the first etching step. Advantageously, deep etching (like DRIE) is applied in the first etching step. Other etching methods can, however, be used within the scope. For example anisotropic silicon wet etchants, such as KOH (Potassium hydroxide), with typical concentrations of 10-60 wt % and TMAH (Tetramethylammonium hydroxide), with typical concentrations of 5-25 wt % can be applied.

FIG. 3C illustrates the first etching step. The first etching step may be adjusted to create a gap stop recess that is deep enough for the desired thickness of a gap fill region that covers the gap in the first wafer structure. In the exemplary wafer element, the DRIE etching in the first etching stop could extend to 385 . . . 470 micrometer depth. The back side 304 of the wafer element is shown to include a gap stop recess 308 disposed centrally within the back side surface, and two via stop recesses 310, 312 in either sides of the gap stop recess 308. Other configurations are naturally possible within the scope.

FIG. 3D illustrates removal of the first resist mask. The first resist mask may be removed chemically, for example, with suitable solvent mixtures.

Figure 3E:
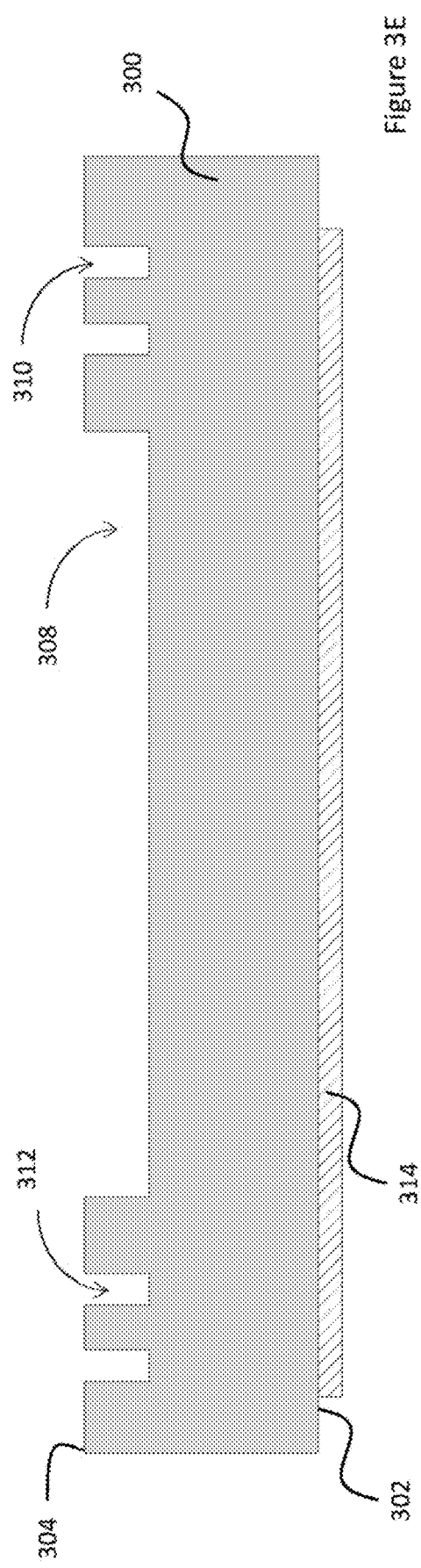

FIG. 3E illustrates a step made to prepare the resulting first wafer structure for anodic bonding with the second wafer structure. For this a glass region is needed in the outer edge of the front side 302 of the wafer element. Accordingly, a second resist mask 314 that covers and thereby protects a central part of the front side in a second etching step may be deposited on the front side 302 of the wafer element 300.

Figure 3F:
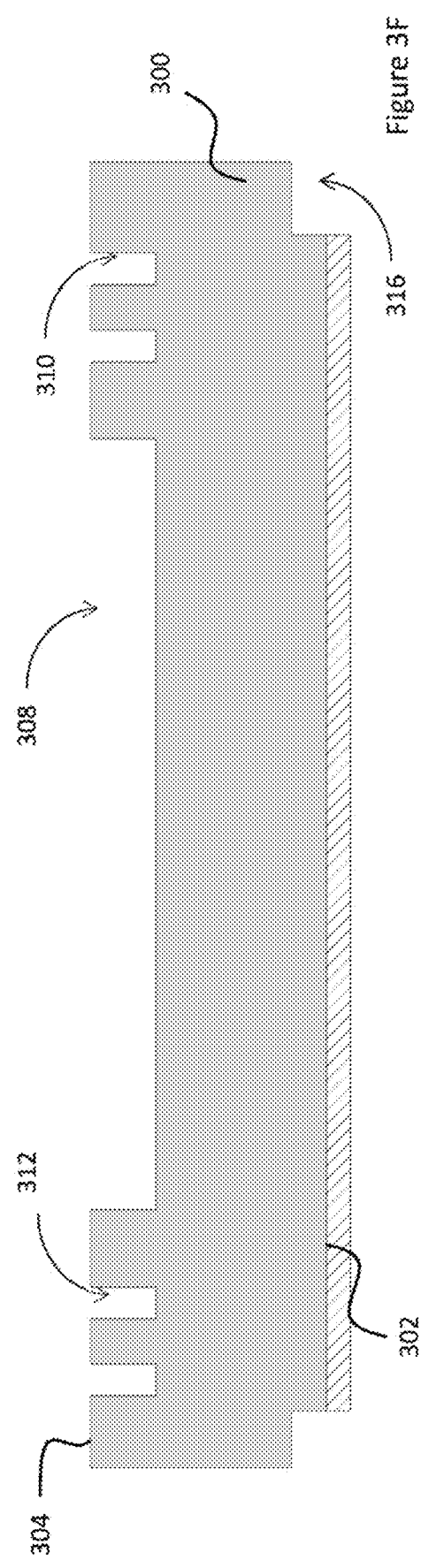

FIG. 3F illustrates the second etching step that creates an outer recess 316 around the perimeter of the surface of the front side 302. Again, deep etching is advantageously applied, but other etching methods can be used within the scope.

FIG. 3G illustrates removal of the second resist mask. The second resist mask may be removed chemically, for example, with suitable solvent mixtures.

FIG. 3H illustrates an optional step of thermal oxidation of the recessed wafer element. A silicon oxide layer 318 of 1.5-2.1 micrometers would be advantageous for the example structure.

FIG. 3I illustrates a step of creating the via fill section and the gap fill section from the electrically insulating material. In this example, these are provided simultaneously by melting a first glass layer 320 on the back side 304 of the recessed wafer element. The first glass layer 320 fills the gap stop recess 308 and the via stop recesses 310, 312 and continuously covers the surface of the back side of the wafer structure.

FIG. 3J illustrates a step where the glass covered back side 304 is ground to a depth below the original back side surface so that a glass filled gap fill section 322, and two electrically insulating via fill sections 324, 326 are formed on the back side 304 of the wafer element 300. The grinding is advantageously made to include a finalising fine grind and chemical mechanical polishing of the resulting glass surface on the gap region 322.

Figure 3K:
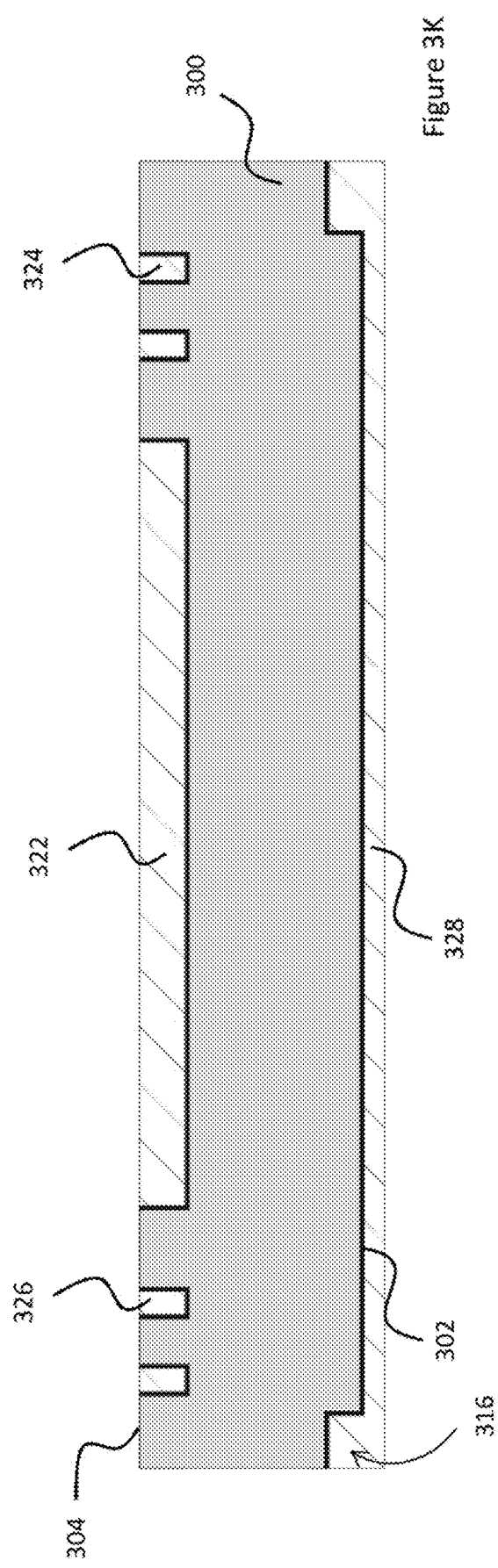

FIG. 3K illustrates a step of melting a second glass layer 328 on the front side 302 of the recessed wafer element. The second glass layer 328 fills the outer recess 316 and is advantageously higher than it.

Figure 3L:
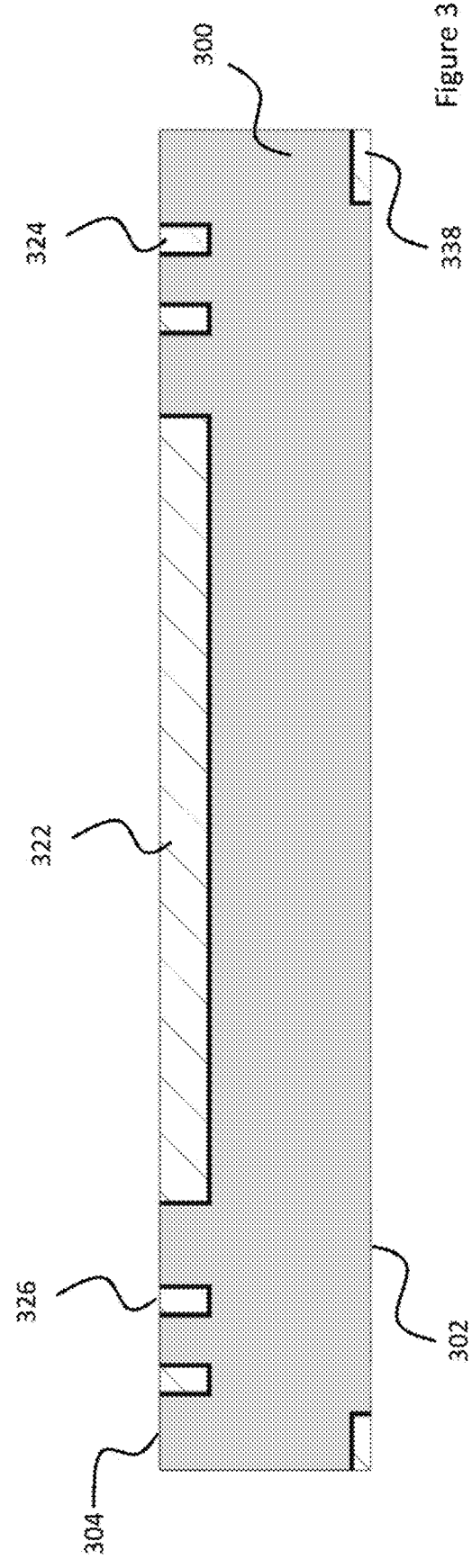

FIG. 3L illustrates a step where the glass covered front side 302 is ground to a depth below the original front side surface so that a glass filled perimeter region 338 is formed on the front side 302 of the wafer element 300. The grinding is advantageously made to include a finalising fine grind and chemical mechanical polishing.

FIG. 3M illustrates a step where first electrical contacts 330, 332 for external access are deposited on the back side 304 of the wafer element. The first electrical contacts 330, 332 may be implemented as wire bond pads, deposited on a surface of the back side so that each one of them is on top of and in contact with a silicon region 340, 342 within an electrically insulating via fill section 324, 326. FIG. 3M illustrates also deposition of second electrical contacts 334, 336 for internal electrical connection to the second wafer structure on the front side 302 of the wafer element. Each one of these second electrical contacts 334, 336 is aligned in the first direction with a respective first electrical contact 330, 332. At this stage, some other internal elements may be added. As an example, FIG. 3M shows a pair of getter pads 344, 346 of reactive material (e.g. Titanium) that are deposited to be included in the gap for the purpose of completing and maintaining the initial conditions in the gap after its closing.

FIG. 3N illustrates a step where a third resist mask 342 is deposited on the front side 302 of the wafer element. The third resist mask 342 may be patterned to define parts of the front side 302 to be recessed for a third etching step. The third resist mask 342 may cover and thereby protect parts of the front side 302 that should not be etched out in the third etching step. These parts include the regions of the front side surface where the second electrical contacts 334, 336 and the pair of getter pads 344, 346 are disposed.

FIG. 3O illustrates the third etching step where via recesses 350, 352 for hollow sections of isolation structures, and a gap recess 354 for an internal gap are formed. In this example, they are again formed in a same etching process. The via fill sections and the gap fill section define an etch stop for the deep recess etching, If thermal oxidation is used, as in this example, the thermal oxidation layer already provides the primary etch stop. If thermal oxidation is not used, the electrically insulating material of the via fill section and the gap fill section provides the etch stop.

FIG. 3P illustrates removal of the third resist mask. The third resist mask may be removed chemically, for example, with suitable solvent mixtures.

It is noted that only stages relevant for disclosing the invention are described herein. A cap wafer for a MEMS structure may include, and typically includes various other layers and elements for reasons and functions not discussed in more detail in the above steps.

It is also noted that the scope covers also other options to form the via fill section. Instead of glass, it is possible, for example, to first use chemical vapor deposition to introduce silicon dioxide on the recessed wafer structure, and then melt a layer of glass for the glass filled gap region 322 in step 3I.

Accordingly, the method illustrated by the above example enables manufacturing a cap wafer structure from a wafer element that includes a back side and a front side. To summarise, the method includes a stage where a gap fill section 322 and an electrically insulating via fill section 324 are formed on a back side of a wafer element. For conciseness, the description of the method refers to one gap fill section and one via fill section of FIG. 1, but a MEMS structure may naturally include one or more gap fill sections and one or more via fill sections, implemented as disclosed herein.

An electrically insulating via fill section 324 is part of an isolation structure that separates a through via from the surrounding wafer element. The through via can be considered to include a first part and a second part such that the first part is exposed in the back side of the wafer element and the second part is exposed in the front side of the wafer element. The electrically insulating via fill section 324 surrounds the first part 340 of the through via. In cross-section, the through via is advantageously round, and the cross-section of the isolation structure thus forms an annular ring around it. Other forms are, however, possible within the scope. Recesses for the gap fill section 322 and the via fill section 324 are advantageously, but not necessarily etched in one process. After the recesses have been etched, the wafer element can undergo thermal oxidation process that produces a thin oxide layer 318 on the wafer element. Grinding of the back side of the wafer element needs only to progress to a level where the wafer element becomes again exposed.

A gap recess 354 and a via recess 350 can then be etched on a front side 302 of the wafer element. In this example, both recesses are etched in a same etching process, but separate processes may be used within the scope. The via recess 350 forms a second part of the through via by creating a hollow section that surrounds the second part of the through via in the wafer element. In the first direction, etching of the gap recess 354 is aligned to the gap fill section 322, and etching of the via recess 350 is aligned to the via fill section 324. Accordingly, when etching removes material of the wafer element and thus progresses in the first direction through the wafer element, the gap recess 354 eventually comes across the gap fill section 322. Correspondingly, when etching removes material of the wafer element and thus progresses in the first direction through the wafer element, the via recess 350 eventually comes across the via fill section 324. The via recess 350 in combination with the via fill section 324 then form an isolation structure that includes a hollow section and the via fill section of solid electrically insulating material. The via fill section 324 provides the solid electrically insulating material that separates the first part 340 of the through via from the wafer element 300, and the via recess 350 provides the hollow section that separates the second part of the through via from the wafer element 300. The deep recess etching process is stopped by glass or the thermal oxidation layer on the gap fill section 322, so the height of the gap is accurately defined by the depth of the gap fill section, notwithstanding process variations, like penetration rate variations of the etching process. Correspondingly, the electrically insulating material of the via fill section 324, or thermal oxidation layer on it, functions as an etch stop for etching of the via recess 350.

To provide a functional capping where electrical signalling is enabled to run through the cap wafer, a first electrical contact 330 for external access is formed on the back side of the wafer element. The first electrical contact 330 is provided on top of the first part of the through via 340 and into electrical contact with it. A second electrical contact 334 is formed on the front side of the wafer element, on top of the second part of the through via. The second electrical contact enables an electrical connection from the first electrical contact 330, through the through via and the second electrical contact 334 to an electrical contact on a wafer structure that is to be capped by the cap wafer. As shown in FIG. 1, a further getter layer 162 can be deposited on the bottom of the gap recess 122.

Until now, the second wafer structure 102 has been referred to as one unified element. However, this is not necessarily the case. The second wafer structure 102 may be formed of a device wafer structure 170 and a glass wafer structure 172, each of which is manufactured separately, and bonded to each other and to the first wafer structure 100 to form in combination the described MEMS-structure. Furthermore, the structure disclosed in FIG. 1 enables an optimal combination where all three wafer structures can be bonded in a very tight and robust manner in one bonding process. In the MEMS structure of FIG. 1, the voltage for piezoelectric transducers that move in the out-of-plane direction with suspenders within the gap 160 can be brought into the internal gap through the cap wafer, which means that the surfaces to be joined can be designed optimal for bonding. By using a pre-polished glass disc, an optical window with high optical quality can be provided in the MEMS structure through the glass wafer. All this can be achieved in a simple manner with a combination of three simultaneously bonded wafer structures.

It is noted that the outer glass surface of the gap fill section 140 is copied from the silicon surface deep etched in stage 3C, so the gap fill section, even if made of glass, may not provide the same level of optical quality as the optical window through the glass wafer 172. Accordingly, a far-ranging primary optical function of the MEMS is advantageously implemented through the optical window in the second wafer structure, here through the optical window in the glass wafer 172. However, the optical quality of the gap fill section 140 achievable with the disclosed process into the cap may be applicable for several secondary operational functions of a scanning mirror. For example, motion of the mirror can be detected with a detector arrangement (not shown) positioned close to the gap fill section 140.

Figure 4:
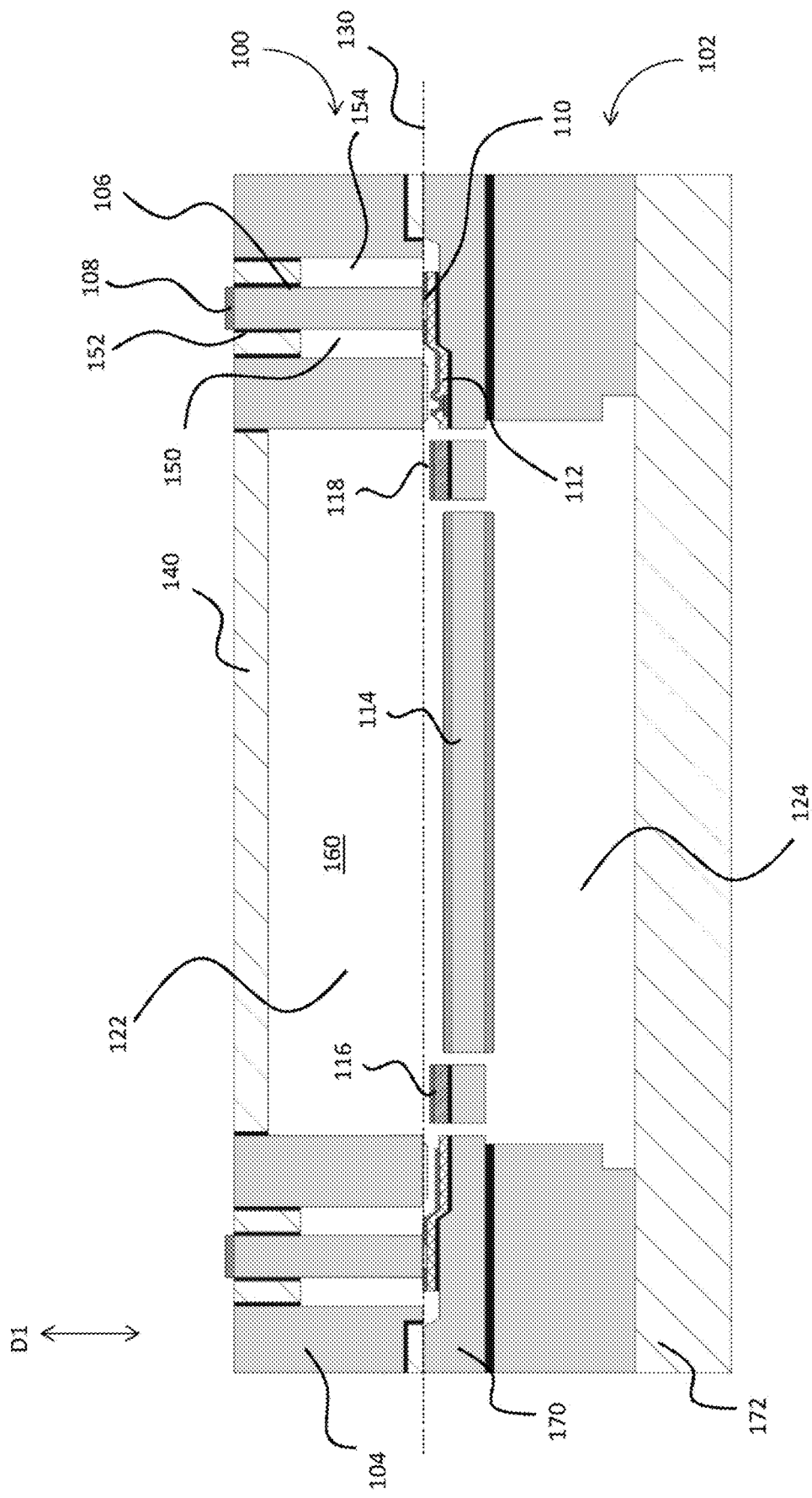
FIG. 4 shows another example of the claimed MEMS structure.

FIG. 4 shows another example of the claimed MEMS structure where the optical quality of the gap fill section 140 is further improved. The MEMS structure of FIG. 4 by far corresponds to the one described with FIG. 1, and corresponding parts are thus numbered similarly. In this example, optical quality of the gap fill section 140 has been improved by leaving out the optional getter layer 162 of FIG. 1. Furthermore, the method has been complemented with a step of removing the thermal oxidation layer from the surface of the glass fill section after step 3P. The thermal oxidation layer is advantageously removed with a method other than the deep etching method so that the optical quality of the following glass surface is not essentially reduced. As shown in FIG. 4, the mirror element 114 can then also include two reflecting surfaces, one on each side of the mirror element 114.

The invention claimed is:
1. A microelectromechanical structure, comprising:
 a first wafer structure attached by bonding to a second wafer structure, wherein,
  a reference plane lies at an interface between the first wafer structure and the second wafer structure, the first wafer structure comprises a build part of uniform silicon wafer material, a through via, and an isolation structure separating the through via from the build part;

the through via extends between a first electrical contact and a second electrical contact through the build part of the first wafer structure in a first direction;

the first electrical contact is on one side of the build part, the second electrical contact is on another side of the build part opposite the first electrical contact, and the second electrical contact at least partially lies in the reference plane;

the first electrical contact of the first wafer structure is accessible externally and the second electrical contact of the first wafer structure connects to an internal electrical contact on the second wafer structure, wherein the internal electrical contact is connected to a transducer structure which includes an actuator that converts energy provided in the form of an electrical signal into mechanical motion, and the internal electrical contact is connected between the second electrical contact and the transducer structure;

in the first direction, the extent of the isolation structure comprises a hollow section and a via fill section; and the via fill section is filled with solid electrically insulating material.

2. The microelectromechanical structure of claim 1, wherein the solid electrically insulating material comprises glass or silicon dioxide.

3. The microelectromechanical structure of claim 1, wherein the first wafer structure or the second wafer structure comprises, or both the first wafer structure and the second wafer structure comprise, a recess that is hermetically sealed by the bonded attachment of the first wafer structure and the second wafer structure, wherein the recess or recesses form an internal gap into the microelectromechanical structure.

4. The microelectromechanical structure of claim 3, wherein the hollow section and the internal gap form a combined void or gas-filled space within the microelectromechanical structure.

5. The microelectromechanical structure of claim 3, wherein at least one mobile structure is suspended to the second wafer structure to move in the internal gap.

6. The microelectromechanical structure of claim 5, wherein the mobile structure comprises an oscillating mirror element.

7. The microelectromechanical structure of claim 6, wherein the transducer structure is configured to actuate the oscillating mirror element.

8. The microelectromechanical structure of claim 7, wherein the transducer structure comprises a suspender and a piezoelectric element on the suspender;

the suspender couples elastically the oscillating mirror element to the second wafer structure; and the internal electrical contact is connected to the piezoelectric element.

9. The microelectromechanical structure of claim 3, wherein the first wafer structure comprises a central recess and a gap fill section of the solid electrically insulating material over the recess.

10. The microelectromechanical structure of claim 1, wherein the second wafer structure comprises a device wafer structure and a glass wafer structure.

* * * * *